(12) United States Patent
Morey

(10) Patent No.: US 10,119,191 B2
(45) Date of Patent: Nov. 6, 2018

(54) HIGH FLOW GAS DIFFUSER ASSEMBLIES, SYSTEMS, AND METHODS

(71) Applicant: Applied Materials, Inc., Santa Clara, CA (US)

(72) Inventor: Travis Morey, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 261 days.

(21) Appl. No.: 15/177,183

(22) Filed: Jun. 8, 2016

(65) Prior Publication Data
US 2017/0356085 A1    Dec. 14, 2017

(51) Int. Cl.
*F26B 11/00*    (2006.01)
*C23C 16/44*    (2006.01)

(52) U.S. Cl.
CPC ................ *C23C 16/4408* (2013.01)

(58) Field of Classification Search
CPC ....... F26B 11/00; F26B 21/00; C23C 16/4408
USPC .......................................................... 34/451
See application file for complete search history.

(56) References Cited

U.S. PATENT DOCUMENTS

| | | | |
|---|---|---|---|
| 4,514,458 A | 4/1985 | Thorn et al. | |
| 4,540,326 A | 9/1985 | Southworth | |
| 5,211,733 A | 5/1993 | Fukao | |
| 5,378,355 A | 1/1995 | Winkler | |
| 5,407,350 A | 4/1995 | Iwabuchi | |
| 5,426,865 A * | 6/1995 | Ikeda | C23C 14/56 34/404 |
| 5,433,780 A | 7/1995 | Ikeda | |
| 5,789,878 A | 8/1998 | Kroeker et al. | |
| 5,879,127 A | 3/1999 | Grunes et al. | |
| 5,951,770 A | 9/1999 | Perlov et al. | |
| 5,956,859 A * | 9/1999 | Matsumoto | H01L 21/67034 34/208 |
| 6,219,936 B1 * | 4/2001 | Kedo | H01L 21/67028 34/202 |
| 6,267,549 B1 | 7/2001 | Brown et al. | |
| 6,276,072 B1 * | 8/2001 | Morad | H01L 21/67109 34/412 |
| 6,287,386 B1 | 9/2001 | Perlov et al. | |

(Continued)

FOREIGN PATENT DOCUMENTS

| | | |
|---|---|---|
| CN | 102373440 A | 3/2012 |
| CN | 102741975 A | 10/2012 |

(Continued)

OTHER PUBLICATIONS

Taiwan Search Report of Taiwan Application No. 103133782 dated Mar. 9, 2017.

(Continued)

*Primary Examiner* — Stephen M Gravini
(74) *Attorney, Agent, or Firm* — Dugan & Dugan, PC

(57) ABSTRACT

Porous diffuser assemblies including multiple diffuser elements. The porous diffuser assemblies include a diffuser body, a diffuser base coupled to the diffuser body and forming a plenum there between, the diffuser base including a plurality of openings formed therein, and a porous diffuser element disposed in each of the plurality of openings wherein surfaces of the porous diffuser elements are exposed to the plenum. Gas purged chambers and methods of purging a chamber are disclosed, as are numerous other aspects.

10 Claims, 9 Drawing Sheets

(56) References Cited

U.S. PATENT DOCUMENTS

| | | | |
|---|---|---|---|
| 6,379,095 B1 | 4/2002 | Elliot et al. | |
| 6,468,353 B1 | 10/2002 | Perlov et al. | |
| 6,575,737 B1 | 6/2003 | Perlov et al. | |
| 6,582,175 B2 | 6/2003 | Cox et al. | |
| 6,722,834 B1 | 4/2004 | Tepman | |
| 6,916,397 B2 | 7/2005 | Pfeiffer et al. | |
| 6,996,453 B2 | 2/2006 | Ahn et al. | |
| 7,107,701 B2 * | 9/2006 | Takemura | H01L 21/02052 134/102.3 |
| 7,228,645 B2 * | 6/2007 | Pham | H01L 21/67034 118/608 |
| 7,367,138 B2 * | 5/2008 | Sogard | G03F 1/82 156/345.4 |
| 7,437,834 B2 * | 10/2008 | Nakatsukasa | H01L 21/02052 34/381 |
| 7,637,029 B2 * | 12/2009 | Kamikawa | H01L 21/67023 134/902 |
| 7,644,512 B1 * | 1/2010 | Liu | C11D 11/0041 118/65 |
| 7,720,655 B2 | 5/2010 | Rice | |
| 7,867,700 B2 | 1/2011 | Fang et al. | |
| 8,287,646 B2 * | 10/2012 | Mitrovic | C23C 16/45574 118/715 |
| 8,677,650 B2 * | 3/2014 | Watterodt | F26B 15/04 34/381 |
| 8,833,743 B2 | 9/2014 | Ko et al. | |
| 9,157,557 B2 | 10/2015 | Krall | |
| 9,536,710 B2 * | 1/2017 | Knyazik | H01J 37/3244 |
| 2002/0170672 A1 | 11/2002 | Perlov et al. | |
| 2005/0072716 A1 | 4/2005 | Quiles et al. | |
| 2006/0060138 A1 * | 3/2006 | Keller | C23C 16/45565 118/715 |
| 2006/0065194 A1 | 3/2006 | Ham | |
| 2006/0090852 A1 * | 5/2006 | Kido | H01J 37/3244 156/345.33 |
| 2009/0108544 A1 | 4/2009 | Sico et al. | |
| 2010/0178146 A1 | 7/2010 | Kremerman et al. | |
| 2010/0178147 A1 | 7/2010 | Kremerman et al. | |
| 2011/0304063 A1 | 12/2011 | Ko et al. | |
| 2013/0039726 A1 | 2/2013 | Brodine et al. | |
| 2013/0115028 A1 | 5/2013 | Kremerman et al. | |
| 2013/0149076 A1 | 6/2013 | Cox et al. | |
| 2013/0210238 A1 | 8/2013 | Yudovsky | |
| 2013/0284097 A1 * | 10/2013 | Ranish | B05B 3/00 118/728 |
| 2014/0116339 A1 * | 5/2014 | Nasman | C23C 16/45565 118/723 R |
| 2014/0262035 A1 | 9/2014 | Merry et al. | |
| 2014/0262036 A1 | 9/2014 | Reuter et al. | |
| 2014/0262755 A1 | 9/2014 | Deshmukh et al. | |
| 2014/0263165 A1 | 9/2014 | Hongkham et al. | |
| 2014/0271057 A1 | 9/2014 | Weaver et al. | |
| 2014/0273487 A1 | 9/2014 | Deshmukh et al. | |
| 2015/0013771 A1 | 1/2015 | Quiles et al. | |
| 2015/0045961 A1 | 2/2015 | Koshti et al. | |
| 2015/0070814 A1 | 3/2015 | Parkhe et al. | |
| 2015/0082625 A1 | 3/2015 | Rice et al. | |
| 2015/0083330 A1 | 3/2015 | Madiwal et al. | |
| 2015/0090341 A1 | 4/2015 | Ng et al. | |
| 2015/0357228 A1 | 12/2015 | Busche et al. | |
| 2016/0007411 A1 | 1/2016 | Busche et al. | |
| 2016/0007412 A1 | 1/2016 | Busche et al. | |
| 2016/0225646 A1 | 8/2016 | Rice et al. | |
| 2016/0240410 A1 | 8/2016 | Reuter et al. | |
| 2016/0340781 A1 * | 11/2016 | Thomas | C23C 16/45565 |
| 2017/0162366 A1 * | 6/2017 | Yanagisawa | H01J 37/3244 |

FOREIGN PATENT DOCUMENTS

| | | | |
|---|---|---|---|
| EP | 1693880 A3 * | 9/2006 | C23C 16/45565 |
| JP | H02-138420 A | 5/1990 | |
| JP | H05-275519 A | 10/1993 | |
| JP | H07-230959 A | 8/1995 | |
| JP | H11-145241 A | 5/1999 | |
| JP | 2006-216710 A | 8/2006 | |
| JP | 2007-142284 A | 6/2007 | |
| JP | 2013-069818 A | 4/2013 | |
| KR | 10-2006-0135447 | 12/2006 | |
| KR | 10-2007-0026986 | 3/2007 | |
| KR | 10-0807031 B1 | 2/2008 | |
| KR | 10-2013-0031236 | 3/2013 | |
| WO | WO 2010042410 A2 * | 4/2010 | H01L 21/02071 |

OTHER PUBLICATIONS

International Search Report and Written Opinion of International Application No. PCT/US2014/057753 dated Jan. 7, 2015.

Office Action of U.S. Appl. No. 14/498,449 dated Jan. 4, 2016.

Mar. 31, 2016 Reply to Jan. 4, 2016 Office Action of U.S. Appl. No. 14/498,449.

International Preliminary Report on Patentability of International Application No. PCT/US2014/057753 dated Apr. 14, 2016.

Notice of Allowance of U.S. Appl. No. 14/498,449 dated Jul. 20, 2016.

Madiwal et al.., U.S. Appl. No. 15/238,604, titled: "Gas Systems and Methods for Chamber Ports", filed Aug. 16, 2016.

Busche, U.S. Appl. No. 14/920,758, titled: "Optical Fiber Temperature Sensors, Temperature Monitoring Apparatus, and Manufacturing Methods," filed Oct. 22, 2015.

Brashear et al.., U.S. Appl. No. 15/194,360, titled: "Gas Systems and Methods for Chamber Ports", filed Aug. 16, 2016.

Wolgast, U.S. Appl. No. 15/267,231, titled: "Assemblies and Methods of Process Gas Flow Control", filed Sep. 16, 2016.

Chinese Search Report of Chinese Application No. 201480053795.0 dated Jan. 9, 2018.

* cited by examiner

HIGH FLOW GAS DIFFUSER ASSEMBLIES, SYSTEMS, AND METHODS

FIELD

Embodiments of the present disclosure relate to electronic device manufacturing, and more specifically to gas diffuser assemblies, systems, and methods for providing gas purge of a chamber.

BACKGROUND

Electronic device manufacturing systems may include one or more process chambers that are adapted to carry out any number of processes, such as degassing, cleaning or pre-cleaning, deposition such as chemical vapor deposition (CVD), physical vapor deposition (PVD), or atomic layer deposition (ALD), coating, oxidation, nitration, etching (e.g., plasma etch), or the like. One or more load lock chambers may also be provided to enable entry and exit of substrates from a factory interface (otherwise referred to as an "Equipment Front End Module (EFEM)"). Each of these process chambers and one or more load lock chambers may be included in a cluster tool, where a plurality of process chambers and one or more load lock chambers may be distributed about a transfer chamber, for example. A transfer robot may be housed within the transfer chamber and adapted to transport substrates on one or more end effectors to and from the various process chambers and one or more load lock chambers. A slit valve opening may be provided between the transfer chamber and each process chamber and load lock chamber. One or more end effectors of the transfer robot may pass through the slit valve opening to place or extract a substrate (e.g., a silicon-containing disc) into, or from, a support (e.g., a pedestal or lift pins) provided within the process chamber or load lock chamber.

Once the substrate is properly disposed within the process chamber, the slit valve may be closed, and the processing of the substrate may commence. As part of the processing, particulates may be formed due to moving components in the system, relative motion between the substrate and the end effector, and other sources. Regardless of their origin, if such particulates come to rest on the processed substrates, substrate quality may be impacted. To minimize particulates, some prior systems have included a plurality of individual gas diffuser assemblies. Although such systems have been effective at providing particulate reduction, such individual gas diffuser assemblies may suffer from certain performance problems and may be relatively costly.

Accordingly, improved gas diffuser assemblies, systems, and methods for chamber gas purge are desired.

SUMMARY

In one embodiment, a gas diffuser assembly is provided. The gas diffuser assembly includes a diffuser body, a diffuser base coupled to the diffuser body and forming a plenum there between, the diffuser base including a plurality of openings formed therein, and a porous diffuser element disposed in each of the plurality of openings, wherein surfaces of the porous diffuser elements are exposed to the plenum.

In another embodiment, a gas purged chamber is provided. The gas purged chamber includes a chamber adapted to contain a substrate therein, the chamber at least partially formed by one or more side walls, a chamber lid, and a chamber floor, and a gas diffuser assembly coupled to the chamber lid, the gas diffuser assembly including: a diffuser body, a diffuser base coupled to the diffuser body and forming a gas plenum there between, the diffuser base including a plurality of openings formed therein, and a porous diffuser element disposed in each of the plurality of openings, wherein surfaces of the porous diffuser elements are exposed to the plenum.

In another embodiment, a method of purging a chamber is provided. The method includes providing a chamber at least partially formed by a chamber body including a chamber lid, one or more side walls, and a chamber floor, the chamber containing a substrate, providing gas diffuser assembly coupled to the chamber body, the gas diffuser assembly including: a diffuser body, a diffuser base coupled to the diffuser body and forming a plenum there between, the diffuser base including a plurality of openings formed therein, and a porous diffuser element disposed in each of the plurality of openings wherein surfaces of the porous diffuser elements are exposed to the plenum, and purging the chamber by inflow of a purge gas through the porous diffuser elements disposed in each of the plurality of openings.

Other features and aspects of embodiments of the present disclosure will become more fully apparent from the following detailed description, the appended claims, and the accompanying drawings.

DETAILED DESCRIPTION

Figure 1A:
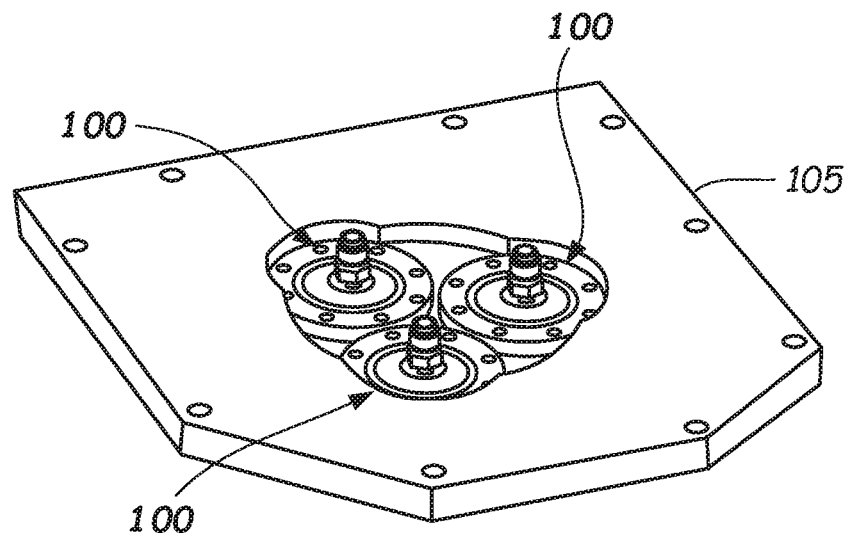
FIG. 1A illustrates an isometric top view of a gas diffuser assembly according to the prior art.
Figure 1B:
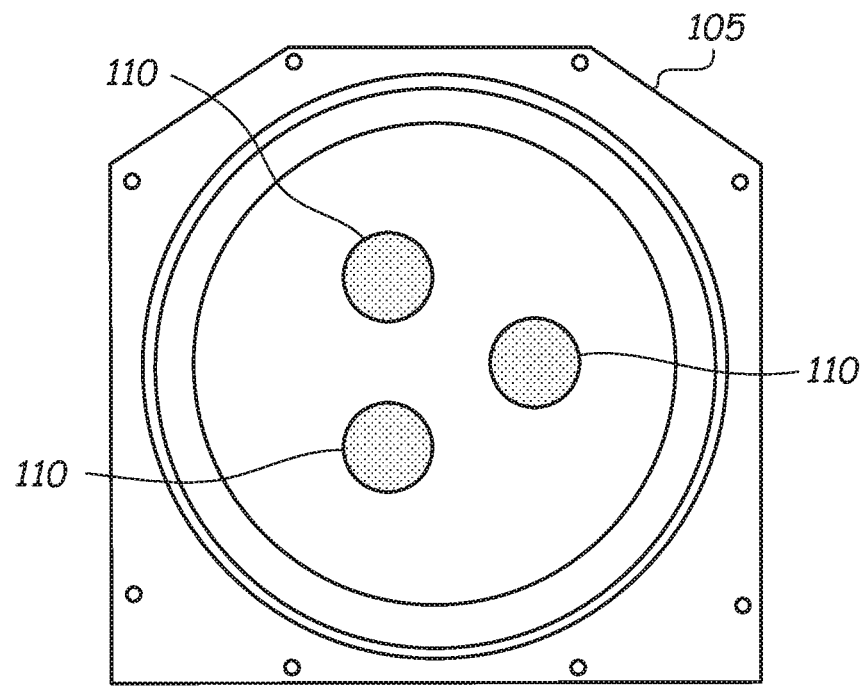
FIG. 1B illustrates a bottom isometric view of a gas diffuser assembly according to the prior art.

Electronic device manufacturing systems may include load lock chambers and transfer chambers as discussed above. Load lock chambers may include, at times, a gas purge into the chamber in an attempt to equalize pressure with an adjacent lower pressure volume to which the substrate is entering into. As best shown in FIGS. 1A and 1B, a load lock may include multiple individual diffuser assemblies 100 coupled to the chamber lid 105, each including a single diffuser element 110 coupled thereto according to the prior art. Likewise, purge of a transfer chamber may include purge through a plurality of individual diffuser assemblies each including a single diffuser element as is shown and described in disclosed in US Pat. Pub. 2015/0090341 to Ng et al.

Although such individual diffuser assemblies (e.g., diffuser assembly 100) may function effectively for their intended purpose, such gas purge systems may suffer from relatively high gas backpressure, may tend to be costly, and/or may take up a large space on the chamber lid. Thus, improved gas purge assemblies are provided that address one or more of these concerns.

In one or more embodiments, a gas diffuser assembly is provided including a diffuser body, a diffuser base coupled to the diffuser body and forming a common gas plenum between the diffuser body and base, wherein the diffuser base includes a plurality of openings formed therein. A diffuser element is disposed in each of the plurality of openings. The diffuser element may be a porous element, such as a porous disc. As such, each of the porous diffuser elements is exposed to, and receives gas from, the common gas plenum, i.e., the porous diffuser elements are arranged as an array on the diffuser base.

Advantageously, in one or more embodiments, lower back pressure may be provided during operation of the gas diffuser assembly, by reducing the overall number of plenum chambers, as well as by reducing a number of smaller gas connections and conduits. Furthermore, relatively lower cost and simplicity of installation may be achieved as compared to using a plurality of individual diffuser elements as provided in the prior art. One or more of these advantages may be achieved through the reduction in the number of sealing components (e.g., O-rings) and thus potential areas for leakage, reduction in a number of components including a lower number of gas inlet conduits, thus simplifying installation, a reduction in a number of fasteners used to attach the gas diffuser assembly to the chamber lid, and/or a reduction in the amount of overall machining being performed on the chamber lid. Moreover, the overall size of the prior art collection of individual assemblies may be made relatively smaller and a relatively larger cross-sectional area of the seal is possible, thus possibly improving sealing to the chamber lid. Some of these advantages may be accomplished while also achieving equivalent or lower particulate counts within the chamber as compared to prior art systems including a collection of individual gas diffuser assemblies. Thus, embodiments of the present disclosure may provide the same or improved substrate yield from the system/tool using the improved gas diffuser assembly.

In summary, according to one or more embodiments described in the present disclosure, improved gas diffuser assemblies, gas purged chambers, and methods of gas purging a chamber are provided. The improved gas diffuser assembly is useful for purging either a load lock chamber or a transfer chamber that are adapted to contain one or more substrates and which may be subject to a vacuum change. The chambers may include one or more side walls, a chamber lid, and a chamber floor. The chamber lid, or optionally, one or more of the chamber floor and/or one or more side walls, may include one or more gas diffuser assemblies according to embodiments described herein.

Further details of example embodiments illustrating and describing various aspects and features, including apparatus, system, and method aspects, are described with reference to FIGS. 2A-6 herein.

FIGS. 2A-2D illustrate various views of a first example embodiment of a gas diffuser assembly 200. The gas diffuser assembly 200 may be adapted for use in electronic device processing systems that may be adapted to process substrates (e.g., silicon-containing wafers, both patterned and unpatterned, masked wafers, plates, discs, or the like) by imparting one or more processes thereto. The processes may include, but not limited to, heating, cooling, degassing, cleaning or pre-cleaning, deposition such as chemical vapor deposition (CVD), physical vapor deposition (PVD), or atomic layer deposition (ALD), coating, oxidation, nitration, etching (e.g., plasma etch), or the like. In particular, the gas diffuser assembly 200 may be adapted for use on any system component including a chamber where it is desired to gas purge that chamber from time to time. For example, the gas diffuser assembly 200 may be adapted for use with a load lock chamber or adapted for use with a transfer chamber, where in each case the chamber may be purged from time to time with a purge gas (e.g., $N_2$ or other inert gas). The gas diffuser assembly 200 may allow for purging while providing a gentle, preferably laminar flow through the chamber so as not to disturb, circulate, or recirculate particulates that may be present in the chamber. As such particulate contamination of the substrate in the chamber may be reduced or eliminated.

In more detail, the gas diffuser assembly 200 includes a diffuser body 202, a diffuser base 204 coupled to the diffuser body 202 and forming a plenum 206 (a gas containing chamber) there between. The plenum 206 may include a frustoconical upper surface. The coupling between the diffuser base 204 and the diffuser body 202 may be provided by welding, press fitting, or some form of clamping action, such as clamping between the diffuser body 202 and a chamber lid, wall or floor.

The diffuser base 204 includes a plurality of openings 208 formed therein. The gas diffuser assembly 200 further includes a porous diffuser element 210 disposed in each of the plurality of openings 208 wherein surfaces 210S (e.g., upper surfaces in the orientation shown) of the porous diffuser elements 210 are exposed to the plenum 206 such that the plenum 206 comprises a common plenum supplying purge gas to all the porous diffuser elements 210. The plurality of openings 208 may be circular openings configured to receive disc-shaped porous diffuser elements 210 therein. Other shapes are possible, such as rectangular, square, triangular, or the like.

The gas diffuser assembly 200 may include a gas entry 212 (FIG. 2D) into the plenum 206 through the diffuser body 202. A supply conduit 214 may be coupled to the gas entry 212. A suitable gas fitting 216 may be coupled to the supply conduit 214. However, and suitable means for introduction of purge gas into the plenum 206 may be used. A plurality of holes 218 may be arranged around the periphery of the diffuser body 202 to receive fasteners (e.g., bolts or screws) that thread into threaded bores of the chamber lid, side wall, and/or chamber floor. Other suitable means for fastening the diffuser body 202 to the chamber lid, side wall, and/or floor may be used.

A seal (not shown), such as an elastomeric O-ring seal, may be received in a sealing groove 220 formed in the diffuser base 204 or optionally formed in the diffuser body 202, or even in the chamber lid, side wall, and/or chamber floor (depending on where the gas diffuser assembly 200 is located). The elastomeric O-ring seal may have an outer diameter of between about 140 mm and 230 mm and a cross-sectional diameter of between about 2.6 mm and about 5.3 mm, for example. Other O-ring sizes or types of seals may be used, such as a gasket, sealing compound, or the like.

Each of the porous diffuser elements 210 may be manufactured from a porous metal, a porous ceramic, or a compressed wire mesh, for example. Other suitable materials providing suitable filtering capability may be used. The porosity of the porous diffuser elements 210 may be open porosity. Porous diffuser elements 210 may have a mean pore sufficient to filter the particulates of interest, for example. The porosity of the porous diffuser elements 210 may be formed such that they effectively remove/filter out particulates having a mean diameter of greater than about 0.003 micron. The particulates may be filtered with greater than 99.99% retention, greater than 99.9999% retention, greater than 99.999999% retention or even greater than 99.9999999% retention, for example. In one or more embodiments, the porous diffuser elements 210 may effectively remove/filter out particulates having a mean diameter of greater than about 0.003 micron with greater than 99.9999999% retention. The porous diffuser elements 210 may be coupled to the plurality of openings 208 by any suitable means, such as welding, braising, adhering, mechanical coupling (e.g., clamping), or the like.

In the case of a porous diffuser element 210 made of a porous metal, the metal may be a high purity metal, such as stainless steel or nickel or composites thereof. The porous diffuser element 210, when a metal, may be welded into the plurality of openings 208. The porous metal may be formed by sintering, for example. In the case where the porous diffuser element 210 is a porous ceramic, the porous ceramic may be an alumina, silica carbide, or even cordierite ceramic. Other types of porous ceramics may be used.

The porous diffuser elements 210 may be circular-shaped discs and have an outer diameter of between about 50 mm and about 100 mm, for example. The porous diffuser elements 210 may have a thickness of between about 2 mm and about 8 mm, for example. The thickness of the porous diffuser elements 210 may be less than a thickness of the diffuser base 204, such that the openings 208 may have transitions formed thereon, such as radii or chamfers to help transition the flow into the chamber while minimizing turbulence. The outer diameters of each of the porous diffuser elements 210 may be roughly the same as each other or may optionally be of different diameters. Other diameters and thicknesses as well as other shapes of the porous diffuser elements 210 may be used.

Figure 2A:
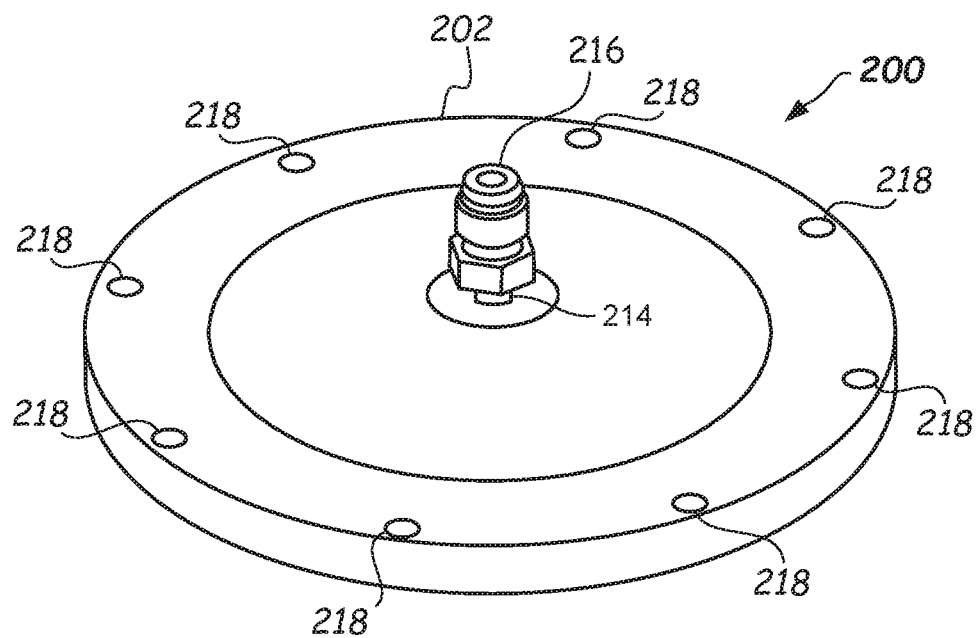
FIG. 2A illustrates an isometric top view of a gas diffuser assembly according to one or more embodiments.
Figure 2B:
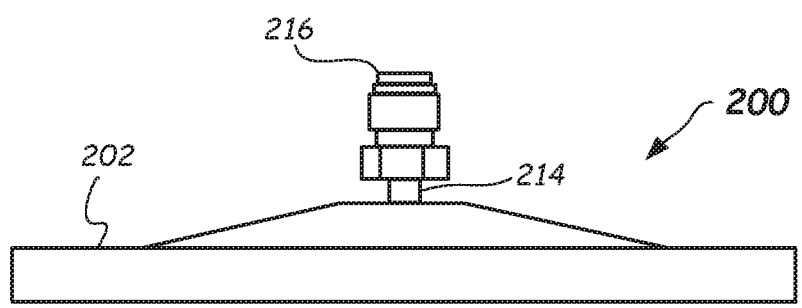
FIG. 2B illustrates a side plan view of a gas diffuser assembly according to one or more embodiments.
Figure 2C:
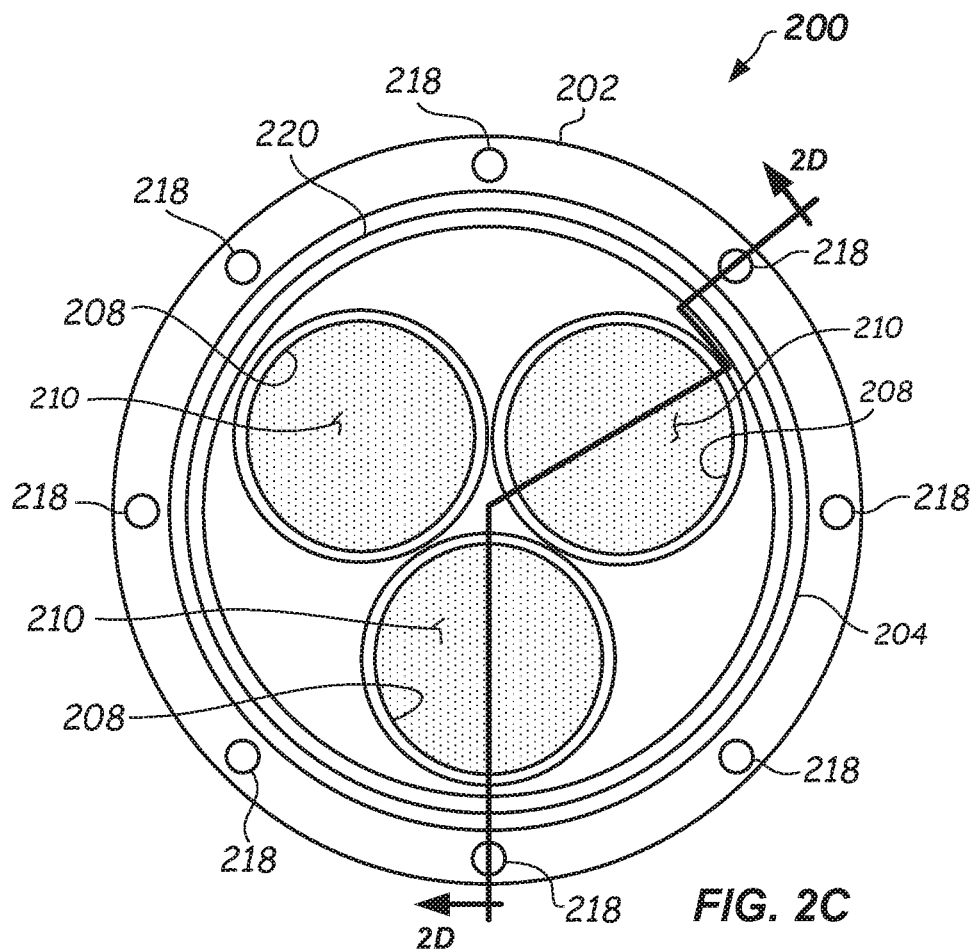
FIG. 2C illustrates a bottom plan view of a gas diffuser assembly according to one or more embodiments.
Figure 2D:
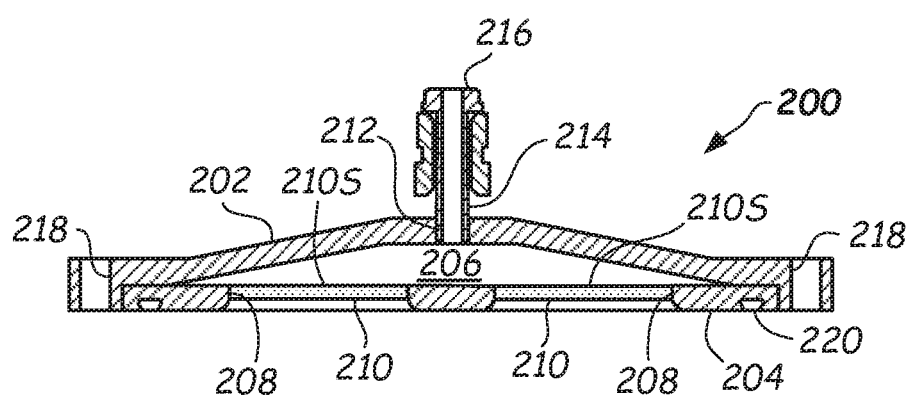
FIG. 2D illustrates a cross-sectioned side view of a gas diffuser assembly taken along section line 2D-2D of FIG. 2C according to one or more embodiments.
Figure 2E:
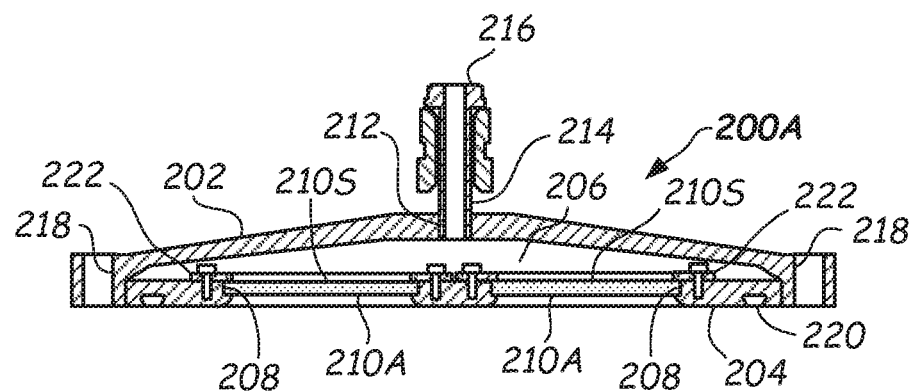
FIG. 2E illustrates a cross-sectioned side view of another gas diffuser assembly according to one or more embodiments.

In the case of porous ceramics or wire metal mesh, the porous diffuser elements 210A of the gas diffuser assembly 200A may be secured in the openings 208 by a securing member 222, such as is shown in FIG. 2E. As shown, the porous diffuser elements 210A may be clamped between the securing member 222 and the diffuser base 204 to hold them in place. Securing member 222 may be a ring or other suitably-shaped structure that is attached to the diffuser base 204 by fasteners (e.g., screws or the like).

The wire mesh may be made of a spring material of suitable stainless steel wire that is formed with a coil spring shape and then compressed in a die to a suitable density to provide filtering capabilities. The wire may be piano wire having a diameter between about 0.0035 inch (0.09 mm) and about 0.02 inch (0.5 mm). Coil spring pitch may be between 0.05 inch (1.3 mm) and about 0.3 inch (7.6 mm), for example. Other details of formation may be found in U.S. Pat. No. 4,514,458, for example.

Figure 3A:
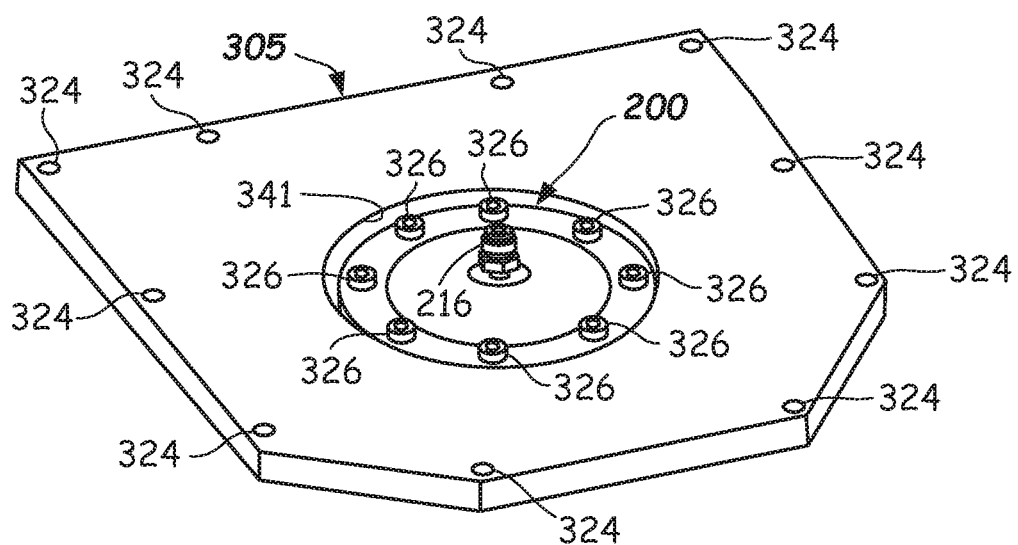
FIG. 3A illustrates an isometric view of a chamber lid including a gas diffuser assembly according to one or more embodiments.
Figure 3B:
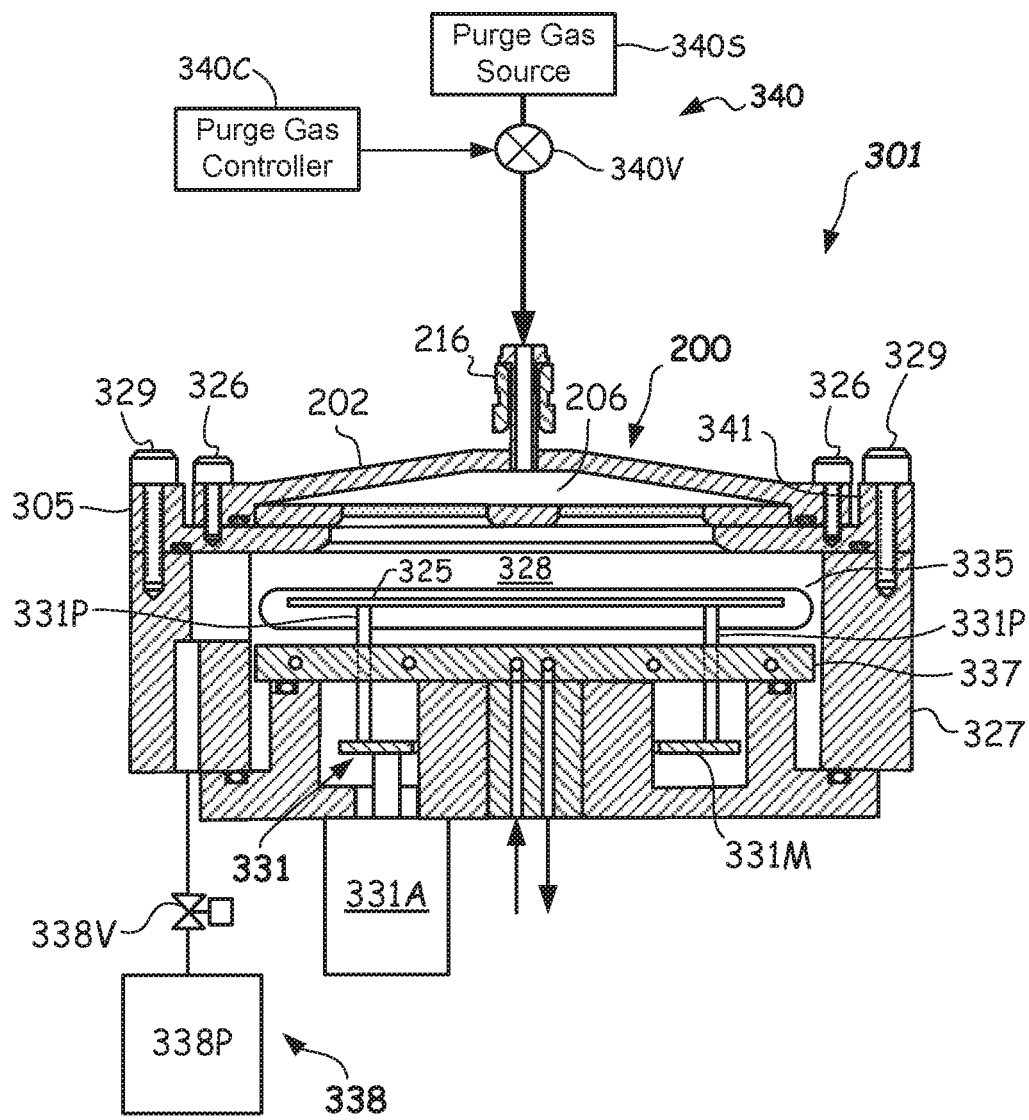
FIG. 3B illustrates a cross-sectioned side view of a load lock chamber of a load lock assembly including a gas diffuser assembly according to one or more embodiments.

FIGS. 3A and 3B illustrate a gas diffuser assembly 200 installed on, and sealed to, a chamber lid 305 of a load lock assembly 301. The chamber lid 305 is configured for coupling and sealing to a load lock chamber body 327 of a load lock assembly 301. The chamber lid 305 may include apertures 324 formed around a periphery thereof and may be configured to couple to the chamber body 327, such as to the top ends of the side walls thereof by lid fasteners 329. Likewise, the gas diffuser assembly 200 may be configured to couple to the chamber lid 305 by diffuser fasteners 326. Lid fasteners 329 and diffuser fasteners 326 may be bolts, screws, or the like. Any suitable seal may be used to seal the chamber lid 305 to the chamber body 327, such as an O-ring, gasket, sealing compound, or the like. Likewise, any suitable seal may be used to seal the gas diffuser assembly 200 to the chamber lid 305, such as an O-ring, gasket, sealing compound, or the like. The seal may be located at any suitable location, such as between the diffuser body 202 and the chamber lid 305, or between the diffuser base 204 and the chamber lid 305, for example. In the depicted embodiment, an O-ring seal is received in an O-ring groove 320 (e.g., an annular groove) formed in the diffuser body 202. A similar O-ring groove of a suitable shape may be provided in the chamber lid 305 of chamber body 327 to allow sealing of the chamber lid to the chamber body 327.

The load lock assembly 301 may include a support assembly 331 that is adapted to support the substrate 325 as the substrate 325 passes through the load lock assembly 301 for entry or exit from processing. Substrates may pass into and out of the load lock assembly 301 through load lock slit valve openings 335 (one of two shown). Support assembly 331 may be a lift assembly including lift pins 331P raised and lowered by lift member 331M under the force provided by lift actuator 331A. A thermal member 337 may be provided to heat or cool the substrate 325 as it passes through the load lock assembly 301. Heating may be provided upon entry or cooling may be provided upon exit of the substrate 325 by contact with the thermal member 337 via lowering of the lift pins 331P to bring the substrate 325 into thermal engagement with the thermal member 337. Any suitable level of heating and/or cooling may be provided, as desired, for the process taking place in the tool. Heating and/or cooling may be provided by any suitable mechanism, such as resistive heating, or optionally fluid-containing passages carrying flows of heated or cooled liquid or gas to and from the thermal member 337, as shown by arrows. Any suitable vacuum for the process may be provided by evacuation assembly 338 including a vacuum pump 338P and a control valve assembly 338V.

Purge gas used for the gas purge may be provided by a purge gas supply 340. Purge gas supply 340 may include a purge gas source 340S, such as a pressurized gas-containing vessel, a flow control assembly 340V, which may comprise one or more flow control valves and/or one or more mass flow controllers, or combinations thereof, adapted to control purge gas inflow, and a purge gas controller 340C operably configured to control gas flow through the flow control assembly 340V, the vacuum pump 338P, and the control valve assembly 338V. Purge gas controller 340C may be operatively configured to control the purge gas flow both into and out of the load lock chamber 328. The purge gas supply 340 may include one or more pressure sensors (not shown), which are used to determine when the desired vacuum is achieved. Any suitable vacuum level may be used, such as $1.0 \times 10^{-6}$ Torr or more. Other vacuum levels may be used.

Figure 3C:
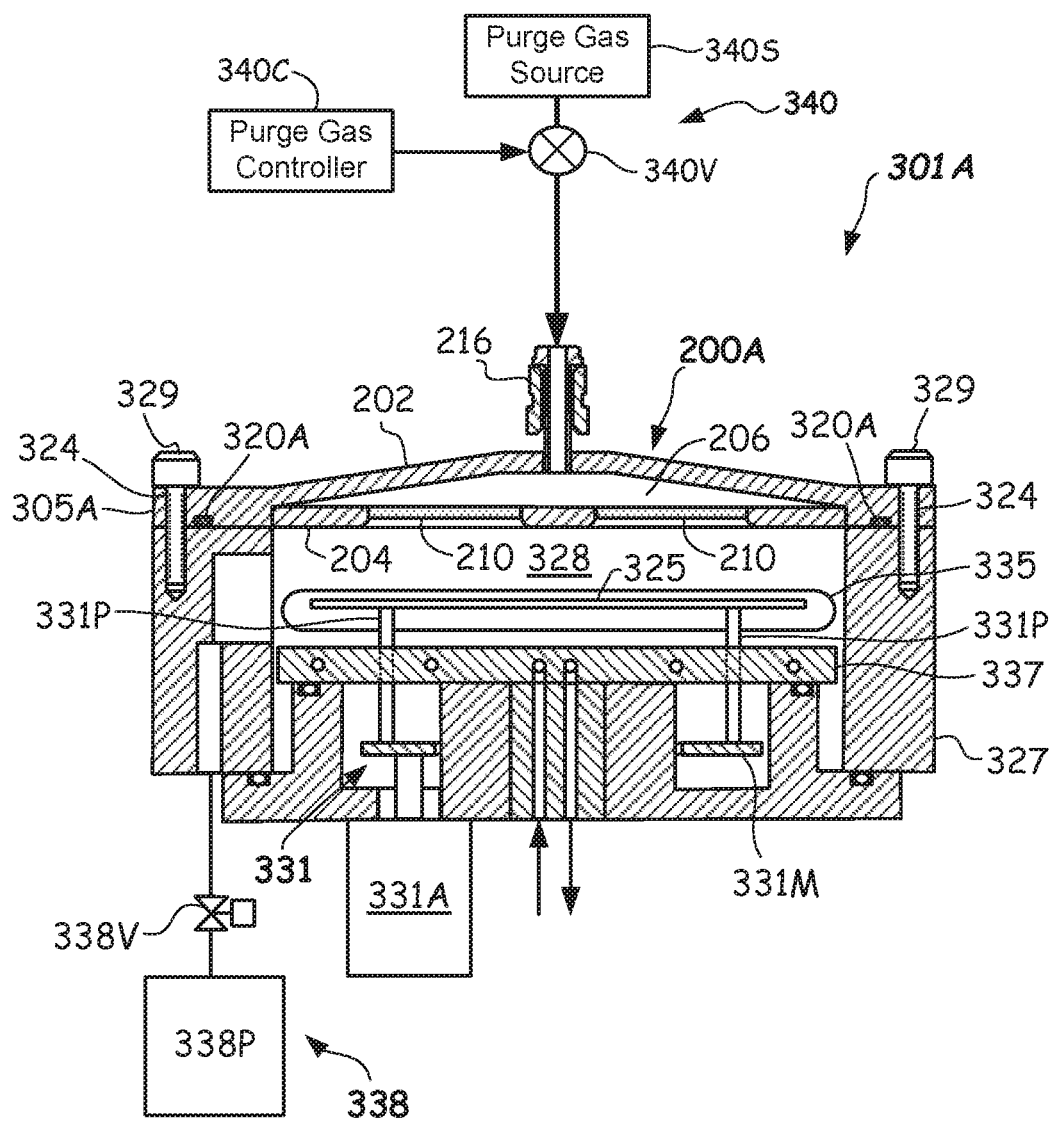
FIG. 3C illustrates a cross-sectioned side view of a load lock chamber of a load lock assembly including a gas diffuser assembly integrated into the chamber lid according to one or more embodiments.

FIG. 3C illustrates a gas diffuser assembly 200A integrated into a chamber lid 305 of a load lock assembly 301A. The chamber lid 305A is configured for coupling and sealing to a chamber body 327 of the load lock assembly 301A. The chamber lid 305A may include apertures 324 formed around a periphery thereof and may be configured to couple to the chamber body 327, such as to the top ends of the side walls thereof by lid fasteners 329. Lid fasteners 329 may be bolts, screws, or the like. Any suitable seal may be used to seal the chamber lid 305A to the chamber body 327, such as an O-ring, gasket, sealing compound, or the like. In the depicted embodiment, an O-ring seal is received in an O-ring groove 320A (e.g., an annular groove) formed in the chamber lid 305A. In the depicted embodiment, the diffuser base 204 and the porous diffuser elements 210 may be the same as previously described. The diffuser body 202, in the depicted embodiment may be made integral with the chamber lid 305, i.e., made from the same piece of material. The remainder of the load lock assembly 301A may be the same as described herein.

It should be recognized that the gas diffuser assembly 200 shown and described herein may be used in other installations. Furthermore, gas diffuser assembly 200 may be used as a gas purge entry or as a gas purge exit, or both. For example, one or more of the gas diffuser assemblies 200 may be used on, and coupled to, a side wall or a chamber floor, or to any two of the chamber lid 305, side wall, or chamber floor, or to all three of them, depending upon the available entry and/or exit locations for the gas purge. As shown, the gas diffuser assembly 200 may be recessed into the chamber lid 305, by providing a recessed region 341 in the chamber lid 305. In other embodiments, the diffuser assembly (e.g., diffuser assembly 200A) may be integrated into the lid, floor or walls.

Figure 4:
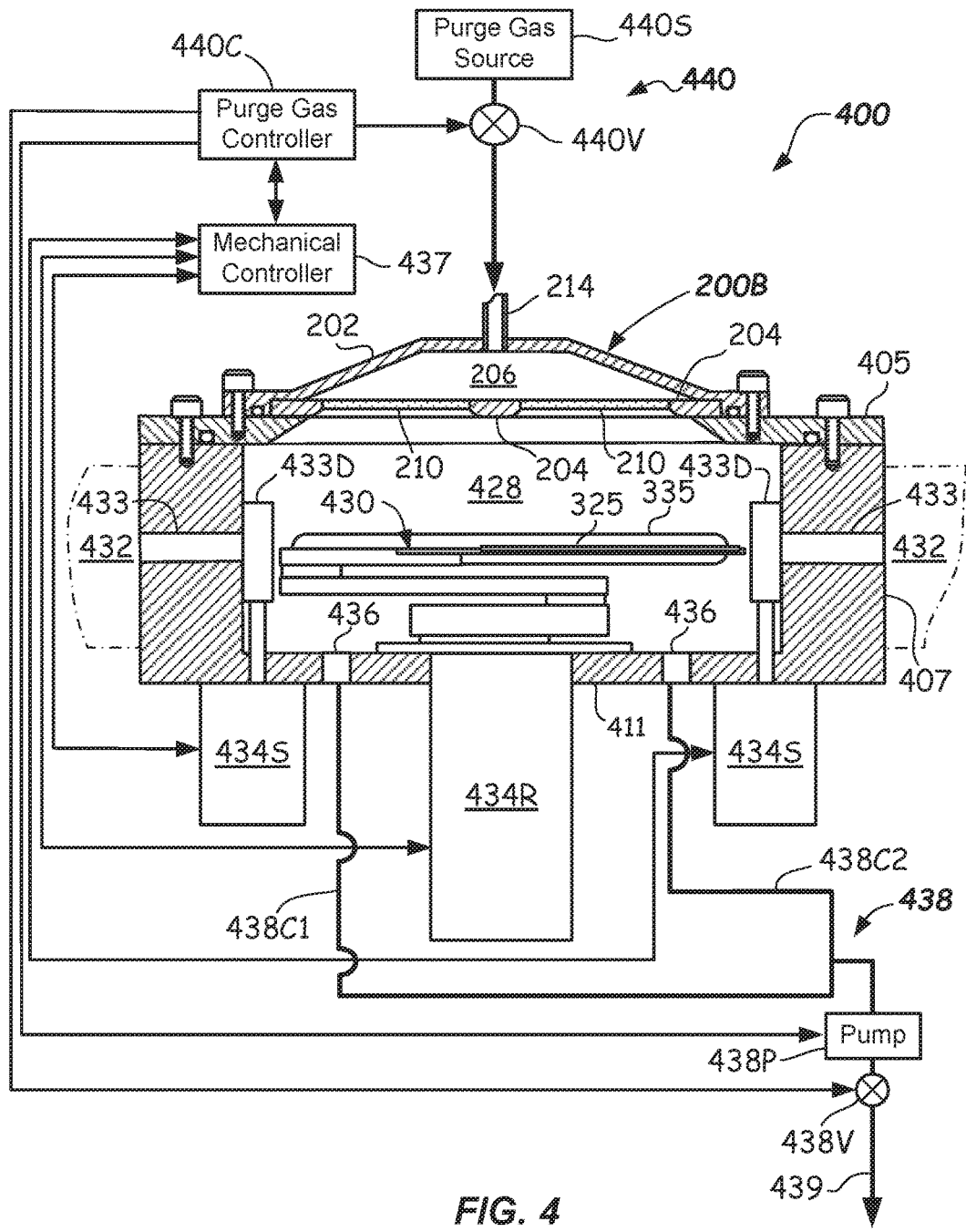
FIG. 4 illustrates a partial cross-sectioned side view of a chamber lid of a transfer chamber including a gas diffuser assembly according to one or more embodiments.

In another embodiment, as shown in FIG. 4, a transfer chamber purge assembly 400 is provided. The gas diffuser assembly 200B of the transfer chamber purge assembly 400 may be coupled to a chamber lid 405 of a transfer chamber 428, as shown. Optionally, the gas diffuser assembly 200B may be coupled to one or more suitable locations on a side wall 407, and/or on a chamber floor 411 of the transfer chamber 428. Transfer chamber 428 is defined by the chamber floor 411, side walls 407, and chamber lid 405, diffuser base 204 and porous diffuser elements 210. Transfer chamber 428 may be configured to contain a transfer robot 430 that may be configured and adapted to transport a substrate 325 to and/or from various process chambers 432 (shown partially and dotted) through process chamber slit valve openings 433 by lowering process chamber slit valve doors 433D. Likewise, transfer robot 430 may be configured and adapted to transport a substrate 325 to and/or from one or more load lock chambers (e.g., 328 of FIG. 3A-3B) through load lock slit valve opening 335 (load lock slit valve door not shown for clarity). For example, the transfer robot 430 may be of any suitable construction, such as described in U.S. Pat. Nos. 5,789,878; 5,879,127; 6,267,549; 6,379,095; 6,582,175; and 6,722,834; and US Pat. Pubs. 2010/0178147; 2013/0039726; 2013/0149076; 2013/0115028; and 2010/0178146, for example. Other suitable robots may be used. Transfer robot 430 and process chamber slit valves doors 433D and load lock slit valve door or doors (not shown) may be controlled by signals to slit valve actuators 434S and robot drive motor 434R from a mechanical controller 437. Mechanical controller 437 may also interface with support assembly 331 (shown in FIG. 3B) and control the lifting and lowering thereof.

As discussed above, the gas diffuser assembly 200B may be used in other locations of the transfer chamber purge assembly 400. In an embodiment where a gas diffuser assembly 200B may be coupled to, and used on, the chamber floor 411, one or more gas diffuser assemblies 200B that may be smaller than the one shown in FIG. 4 coupled to the chamber lid 405 may be located at the locations of the gas exit ports 436 of the chamber floor 411, where purge gas exits the transfer chamber 428 into an exhaust assembly 438. The exhaust assembly 438 may include one or more conduits 438C1, 438C2, one or more control assembly 438V, a vacuum pump 438P, and a vent 439 or optionally a gas treatment apparatus (not shown).

As shown in FIG. 4, gas entry may be through the supply conduit 214 and may be coupled to a purge gas supply 440. Purge gas supply 440 may include a purge gas source 440S, such as a pressurized gas-containing vessel, a flow control assembly 440V, which may comprise one or more flow control valves and/or one or more mass flow controllers, or combinations thereof adapted to control purge gas inflow, and a purge gas controller 440C operably configured to flow through the flow control assembly 440V, the vacuum pump 438P, and the control assembly 438V. Purge gas controller 440C may be operatively configured to control the purge gas flow both into and out of the transfer chamber 428. The purge gas supply 440 may include one or more pressure sensors (not shown), which are used to determine when the desired vacuum is achieved.

In some instances where more than one gas diffuser assembly 200B is used in the system, the purge gas supply 440 may also include an intake manifold (not shown), which may be a collection of gas flow pathways (e.g., conduits) that are coupled between the flow control assembly 440V and the gas entry into each gas diffuser assembly 200B. Purge gas may comprise any suitable gas for the process, such as $N_2$. Other gases, such as inert gases (e.g., Helium, Argon, or the like) may be used.

In operation, flow of the purge gas from the purge gas source 440S flows into the plenum 206 and is distributed to each of the porous diffuser elements 210, approximately equally. Upon exiting diffusely from the porous diffuser elements 210, the purge gas may flow downwardly and over the substrate 325 in the transfer chamber 428, blanketing the substrate 325 with purge gas flow. As shown, a single gas diffuser assembly 200B comprising multiple porous diffuser elements 210 is shown coupled to the chamber lid 405 of the transfer chamber 428. However, more than one gas diffuser assembly 200B may be used when the transfer chamber 428 is relatively large (See FIG. 5).

Operation of the purge gas supply 440 may be adjusted via control signals to the flow control assembly 440V from purge gas controller 440C to provide, in some embodiments, a laminar gas flow pattern above the substrate 325. Purge gas flow rates of between about 1 slm and 500 slm may be provided to the gas diffuser assembly 200B. Gas flow adjustments may be made by adjusting the overall flow rate of the purge gas from the purge gas source 440S to the supply conduit 214.

Figure 5:
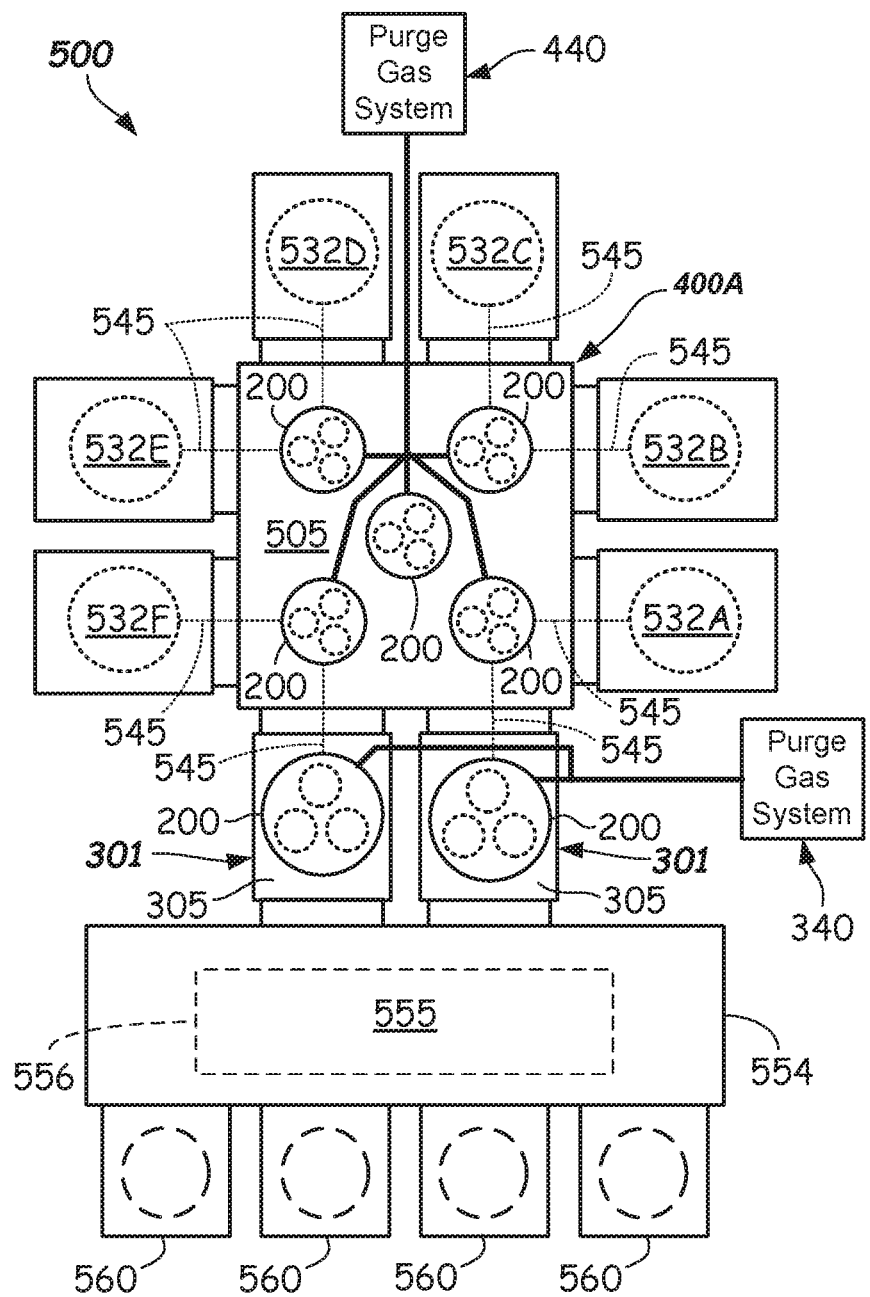
FIG. 5 illustrates a schematic top view of a semiconductor processing tool including gas diffuser assemblies according to one or more embodiments.

FIG. 5 illustrates a schematic top view of a semiconductor device processing assembly 500 including multiple gas purge assemblies 200. Transfer chamber gas diffuser assembly 400A, in this embodiment, includes, as shown, a chamber lid 505 including a plurality of gas purge assemblies 200 coupled thereto for providing purge gas to the transfer chamber (formed underneath chamber lid 505). The gas purge assemblies 200 may provide purge gas flow entering into the transfer chamber above a line of movement 545, shown dotted, of the substrates 325 as the substrate 325 enters into and/or exits from the various chambers (process chambers 532A-532F and load lock chambers of load lock assemblies 301. Purge gas flow may be laminar between the substrates 325 and the chamber lids 305, 505 in some embodiments.

As shown, load lock assemblies 301 couple between and allow passage of substrates 325 between the transfer chamber underneath chamber lid 305 and a factory interface chamber 555 of an equipment front end module (EFEM) 554. A load/unload robot 556 (shown dotted), such as a conventional SCARA robot moveable on a track, may be used to transfer the substrates 325 between substrate carriers 560 docked to load ports of the EFEM 554, and the load lock assemblies 301.

Figure 6:
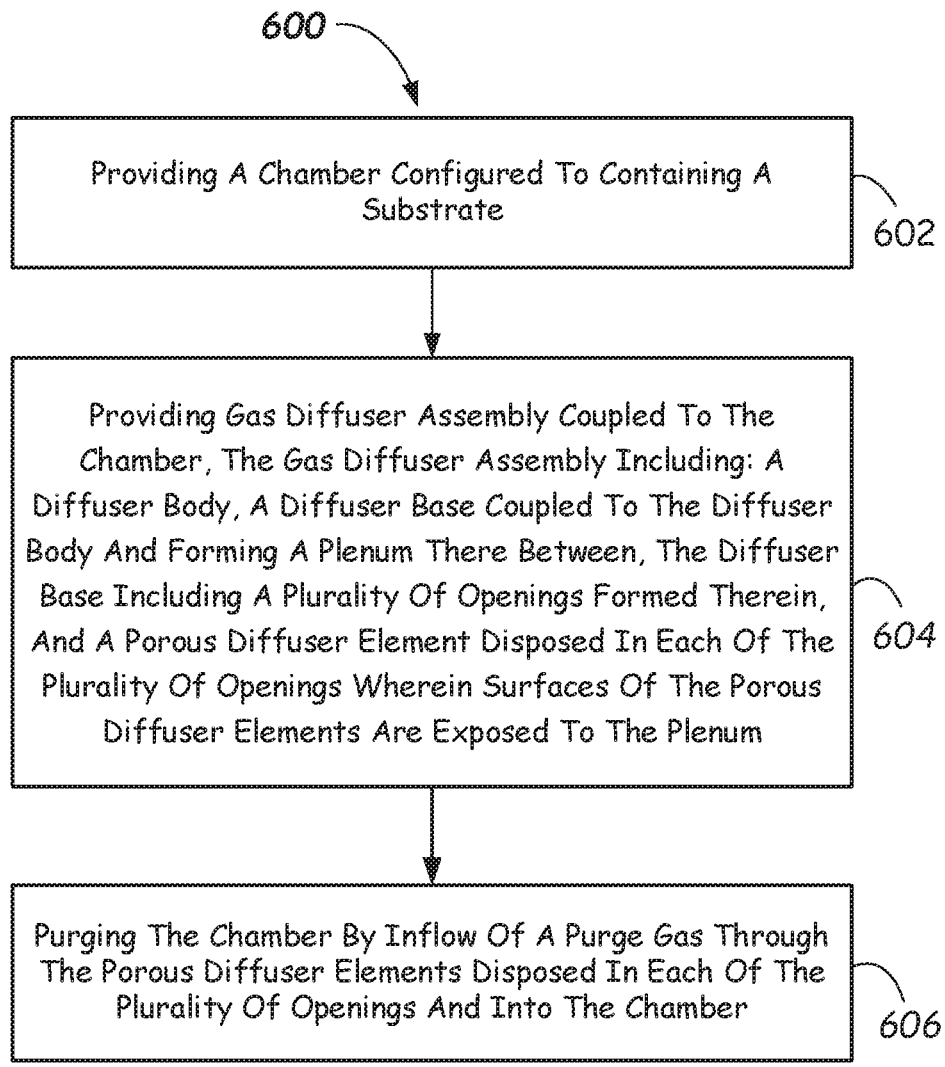
FIG. 6 illustrates a flowchart depicting a method of purging a chamber according to embodiments.

A method 600 of purging a chamber (e.g., load lock chamber 328 or transfer chamber 428) according to one or more embodiments is provided and described with reference to FIG. 6. The method 600 includes, in 602, providing a chamber (e.g., load lock chamber 328 or transfer chamber 428) configured to contain a substrate (e.g., substrate 325), and, in 604, providing gas diffuser assembly (e.g., gas diffuser assembly 200, 200B) coupled to the chamber, the gas diffuser assembly including: a diffuser body (e.g., diffuser body 202), a diffuser base (e.g., diffuser base 204) coupled to the diffuser body and forming a plenum (e.g., plenum 206) there between, the diffuser base including a plurality of openings (e.g., openings 208) formed therein, and a porous diffuser element disposed in each of the plurality of openings wherein surfaces (e.g., surfaces 210S) of the porous diffuser elements (e.g., porous diffuser elements 210) are exposed to the plenum.

The method 600 further includes, in 606, purging the chamber (e.g., load lock chamber 328 or transfer chamber 428) by inflow of a purge gas (e.g., N$_2$ or other suitable gas) through the porous diffuser elements (e.g., porous diffuser elements 210) disposed in each of the plurality of openings (e.g., openings 208), and into the chamber. The flow may be diffused so that the flow over the substrate 325 contained in the chamber (e.g., load lock chamber 328 or transfer chamber 428) may be laminar.

The foregoing description discloses example embodiments. Modifications of the above-disclosed assemblies, systems, and methods which fall within the scope of the disclosure will be readily apparent to those of ordinary skill in the art. Accordingly, while the disclosure has been provided in connection with certain example embodiments, it should be understood that other embodiments may fall within the scope, as defined by the appended claims.

What is claimed is:

1. A gas purged chamber, comprising:
   a chamber configured to contain a substrate therein; and
   a gas diffuser assembly coupled to the chamber, the gas diffuser assembly including:
   a diffuser body,
   a diffuser base coupled to the diffuser body and forming a gas plenum there between, the diffuser base including a plurality of openings formed therein, and
   a porous diffuser element disposed in each of the plurality of openings.

2. The gas purged chamber of claim 1, wherein the gas diffuser assembly is coupled to a load lock chamber lid.

3. The gas purged chamber of claim 1, wherein the gas diffuser assembly is coupled to a transfer chamber lid.

4. The gas purged chamber of claim 1, comprising a plurality of the gas diffuser assembly coupled to a transfer chamber lid.

5. The gas purged chamber of claim 1, wherein a thickness of the porous diffuser elements is less than a thickness of the diffuser base.

6. The gas purged chamber of claim 1, a wherein the diffuser base includes transition elements.

7. The gas purge chamber of claim 1, wherein each of the porous diffuser elements are clamped to the diffuser base by a securing member.

8. The gas purge chamber of claim 1, wherein the plenum includes a frustoconical surface.

9. The gas purge chamber of claim 1, wherein the plurality of openings are circular openings configured to receive the porous diffuser elements that are configured to have a disc shape.

10. The gas purge chamber of claim 1, wherein each of the porous diffuser elements comprises a sintered porous metal welded to the diffuser base.

* * * * *